(12) United States Patent
Kyung et al.

(10) Patent No.: US 8,060,805 B2
(45) Date of Patent: Nov. 15, 2011

(54) APPARATUS AND METHOD TO TRANSMIT/RECEIVE SIGNAL IN A COMMUNICATION SYSTEM

(75) Inventors: Gyu-Bum Kyung, Suwon-si (KR);
 Seung-Hoon Choi, Suwon-si (KR);
 Hong-Sil Jeong, Seoul (KR);
 Dong-Seek Park, Yongin-si (KR);
 Jae-Yeol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1106 days.

(21) Appl. No.: 11/849,458

(22) Filed: Sep. 4, 2007

(65) Prior Publication Data
 US 2008/0059862 A1 Mar. 6, 2008

(30) Foreign Application Priority Data
 Sep. 4, 2006 (KR) .................. 10-2006-0084781

(51) Int. Cl.
 *H03M 13/00* (2006.01)
(52) U.S. Cl. ...................... 714/752; 714/758
(58) Field of Classification Search .......... 714/752, 714/758
 See application file for complete search history.

(56) References Cited

U.S. PATENT DOCUMENTS

| 6,985,536 | B2 * | 1/2006 | Oelcer et al. | 375/261 |
| 7,000,167 | B2 * | 2/2006 | Coker et al. | 714/752 |
| 2005/0216821 | A1 * | 9/2005 | Harada | 714/801 |
| 2005/0283709 | A1 * | 12/2005 | Kyung et al. | 714/758 |

FOREIGN PATENT DOCUMENTS

| JP | 2002-033670 A | 1/2002 |
| JP | 2005-277784 A | 10/2005 |
| KR | 10-2005-0039781 A | 4/2005 |
| KR | 10-0567698 A | 3/2006 |
| KR | 10-2006-0050384 A | 5/2006 |

* cited by examiner

*Primary Examiner* — James C Kerveros
(74) *Attorney, Agent, or Firm* — Jefferson IP Law, LLP

(57) ABSTRACT

An apparatus and method for transmitting/receiving a signal in a communication system are provided. A signal reception apparatus of a communication system receives a signal and generates a child Low Density Parity Check (LDPC) codeword vector by decoding the received signal according to a child parity check matrix supporting a first coding rate. The child LDPC codeword vector includes an information vector including A (A≧1) information bits, and when the first coding rate is equal to a coding rate for a case where D (D≧1) parity bits are punctured among B (B≧1)+C (C≧1) parity bits included in a parent LDPC codeword vector generated by encoding the information vector according to a parent parity check matrix supporting a second coding rate, a child bipartite graph corresponding to the child parity check matrix is generated such that a parent bipartite graph corresponding to the parent parity check matrix corresponds to an edge merge scheme.

20 Claims, 5 Drawing Sheets

| | s(110) | | p₁(120) | | p₂(130) | |
|---|---|---|---|---|---|---|
| $P^a_{11}$ | $P^a_{12}$ | $P^a_{13}$ | $P^a_{14}$ | ... | $P^a_{1(n-1)}$ | $P^a_{1n}$ |
| $P^a_{21}$ | $P^a_{22}$ | $P^a_{23}$ | $P^a_{24}$ | ... | $P^a_{2(n-1)}$ | $P^a_{2n}$ |
| $P^a_{31}$ | $P^a_{32}$ | $P^a_{33}$ | $P^a_{34}$ | ... | $P^a_{3(n-1)}$ | $P^a_{3n}$ |
| ⋮ | ⋮ | ⋮ | ⋮ | ... | ⋮ | ⋮ |
| $P^a_{p1}$ | $P^a_{p2}$ | $P^a_{p3}$ | $P^a_{p4}$ | ... | $P^a_{p(q-1)}$ | $P^a_{pq}$ |

FIG.1

|       | BC1 (319) | BC2 (321) | BC3 (323) | BC4 (325) | BC5 (327) | BC6 (329) | BC7 (331) | BC8 (333) | BC9 (335) | BC10 (337) | BC11 (339) | BC12 (341) |
|-------|-----------|-----------|-----------|-----------|-----------|-----------|-----------|-----------|-----------|------------|------------|------------|
| BR1 (311) | 5  | 8  | -1 | 13 | -1 | 18 | -1 | -1 | 4  | 0  | -1 | -1 |
| BR2 (313) | -1 | -1 | 10 | -1 | 19 | -1 | 11 | 16 | -1 | 0  | 0  | -1 |
| BR3 (315) | -1 | 9  | -1 | -1 | 6  | -1 | 17 | -1 | 0  | -1 | 0  | 0  |
| BR4 (317) | 7  | -1 | 20 | 14 | -1 | 12 | -1 | 15 | 4  | -1 | -1 | 0  |

Columns grouped as: s(310) = BC1–BC8, p$_1$(320) = BC9, p$_2$(330) = BC10–BC12

| | BC1 (427) | BC2 (429) | BC3 (431) | BC4 (433) | BC5 (435) | BC6 (437) | BC7 (439) | BC8 (441) | BC9 (443) | BC10 (445) | BC11 (447) | BC12 (449) | BC13 (451) | BC14 (453) | BC15 (455) | BC16 (457) |
|---|---|---|---|---|---|---|---|---|---|---|---|---|---|---|---|---|
| | | | | s(410) | | | | | $p_1$(420) | | | | $p_2$(430) | | | |
| BR1 (411) | 5 | -1 | -1 | 13 | -1 | -1 | -1 | -1 | 4 | 0 | -1 | -1 | -1 | -1 | -1 | -1 |
| BR2 (413) | -1 | 8 | -1 | -1 | -1 | 18 | -1 | -1 | -1 | 0 | 0 | -1 | -1 | -1 | -1 | -1 |
| BR3 (415) | -1 | -1 | 10 | -1 | -1 | -1 | 11 | -1 | -1 | -1 | 0 | 0 | -1 | -1 | -1 | -1 |
| BR4 (417) | -1 | -1 | -1 | -1 | 19 | -1 | -1 | 16 | -1 | -1 | -1 | 0 | 0 | -1 | -1 | -1 |
| BR5 (419) | -1 | 9 | -1 | -1 | -1 | -1 | 17 | -1 | 0 | -1 | -1 | -1 | 0 | 0 | -1 | -1 |
| BR6 (421) | -1 | -1 | -1 | -1 | 6 | -1 | -1 | 15 | -1 | -1 | -1 | -1 | -1 | 0 | 0 | -1 |
| BR7 (423) | 7 | -1 | -1 | 14 | -1 | -1 | -1 | -1 | 4 | -1 | -1 | -1 | -1 | -1 | 0 | 0 |
| BR8 (425) | -1 | -1 | 20 | -1 | -1 | 12 | -1 | -1 | -1 | -1 | -1 | -1 | -1 | -1 | -1 | 0 |

APPARATUS AND METHOD TO TRANSMIT/RECEIVE SIGNAL IN A COMMUNICATION SYSTEM

PRIORITY

This application claims the benefit under 35 U.S.C. §119 (a) of a Korean patent application filed in the Korean Intellectual Property Office on Sep. 4, 2006 and assigned Serial No. 2006-84781, the entire disclosure of which is hereby incorporated by reference.

BACKGROUND OF THE INVENTION

1. Field of the Invention

The present invention relates generally to an apparatus and method to transmit/receive signals in a mobile communication system. More particularly, the present invention relates to an apparatus and method to transmit/receive signals according to a coding rate in a communication system.

2. Description of the Related Art

Next generation communication systems are evolving to provide mobile stations (MSs) with services capable of high-speed, high-capacity data transmission/reception. In the next generation communication systems, various transmission/reception schemes, such as Hybrid Automatic Repeat reQuest (HARQ) scheme and Adaptive Modulation and Coding (AMC) scheme, have been proposed to support the high-speed, high-capacity data transmission/reception. To use the HARQ and AMC schemes, the next generation communication systems should support various coding rates.

It is known that the next generation communication systems are high in performance gain when they perform high-speed data transmission/reception with turbo codes. The systems positively consider using Low Density Parity Check (LDPC) codes that can increase reliability of data transmission by effectively correcting errors caused by noises occurring in transmission channels. However, use of the LDPC code has shortcomings in terms of the coding rate. That is, the LDPC code is not free in terms of the coding rate because its generated codeword has a higher coding rate due to a characteristic thereof. Most of the currently proposed LDPC codes have a coding rate of ½, and only some of them have a coding rate of ⅓. Because the LDPC codes have limitations in terms of the coding rate in this way, it is inappropriate to use the LDPC codes for the schemes that should support various coding rates.

To realize a lower coding rate, it may be possible to find a degree distribution showing the best performance with use of a density evolution technique. However, an LDPC code having the degree distribution showing the best performance is hard to realize due to several restrictions such as a cycle structure in a bipartite graph and its hardware implementation.

Because the LDPC code has limitations in terms of the coding rate due to its characteristic as described above, there is a need for a signal transmission/reception scheme supporting various coding rates from a low coding rate to a high coding rate in a communication system using the LDPC code.

SUMMARY OF THE INVENTION

An aspect of the present invention is to address at least the above mentioned problems and/or disadvantages and to provide at least the advantages described below. Accordingly, an aspect of the present invention is to provide an apparatus and method for transmitting/receiving signals in a communication system using an LDPC code.

Another aspect of the present invention is to provide a signal transmission/reception apparatus and method to support various coding rates using an LDPC code.

According to one aspect of the present invention, a method to transmit a signal in a signal transmission apparatus is provided. The method includes generating a child Low Density Parity Check (LDPC) codeword vector by encoding an information vector including A ($A \geq 1$) information bits using a child parity check matrix supporting a first coding rate and transmitting the child LDPC codeword vector, wherein when the first coding rate is equal to a coding rate for a case where D ($D \geq 1$) parity bits are punctured among B ($B \geq 1$)+C ($C \geq 1$) parity bits included in a parent LDPC codeword vector generated by encoding the information vector using a parent parity check matrix supporting a second coding rate, a child bipartite graph corresponding to the child parity check matrix is generated such that a parent bipartite graph corresponding to the parent parity check matrix corresponds to an edge merge scheme.

According to another aspect of the present invention, a method to transmit a signal in a signal transmission apparatus is provided. The method includes generating a parent Low Density Parity Check (LDPC) codeword vector by encoding an information vector including A ($A \geq 1$) information bits using a parent parity check matrix supporting a first coding rate, generating a final codeword vector by puncturing at least D ($D \geq 1$) parity bits among B ($B \geq 1$)+C ($C \geq 1$) parity bits included in the parent LDPC codeword vector and transmitting the final codeword vector, wherein a parent bipartite graph corresponding to the parent parity check matrix is generated such that a child bipartite graph corresponding to a child parity check matrix supporting a second coding rate corresponds to an edge split scheme.

According to further another aspect of the present invention, a method to receive a signal in a signal reception apparatus is provided. The method includes receiving a signal and generating a child Low Density Parity Check (LDPC) codeword vector by decoding the received signal using a child parity check matrix supporting a first coding rate, wherein the child LDPC codeword vector includes an information vector including A ($A \geq 1$) information bits, and when the first coding rate is equal to a coding rate for a case where D ($D \geq 1$) parity bits are punctured among B ($B \geq 1$)+C ($C \geq 1$) parity bits included in a parent LDPC codeword vector generated by encoding the information vector using a parent parity check matrix supporting a second coding rate, a child bipartite graph corresponding to the child parity check matrix is generated such that a parent bipartite graph corresponding to the parent parity check matrix corresponds to an edge merge scheme.

According to yet another aspect of the present invention, a method to receive a signal in a signal reception apparatus is provided. The method includes receiving a signal and generating a parent Low Density Parity Check (LDPC) codeword vector by decoding the received signal using a parent parity check matrix supporting a first coding rate, wherein the parent LDPC codeword vector includes an information vector including A ($A \geq 1$) information bits, and a parent bipartite graph corresponding to the parent parity check matrix is generated such that a child bipartite graph corresponding to a child parity check matrix supporting a second coding rate corresponds to an edge split scheme.

According to still another aspect of the present invention, a signal transmission apparatus is provided. The signal transmission apparatus includes an encoder to generate a child Low Density Parity Check (LDPC) codeword vector by encoding an information vector including A (A≧1) information bits using a child parity check matrix supporting a first coding rate and a transmitter to transmit the child LDPC codeword vector, wherein when the first coding rate is equal to a coding rate for a case where D (D≧1) parity bits are punctured among B (B≧1)+C (C≧1) parity bits included in a parent LDPC codeword vector generated by encoding the information vector using a parent parity check matrix supporting a second coding rate, a child bipartite graph corresponding to the child parity check matrix is generated such that a parent bipartite graph corresponding to the parent parity check matrix corresponds to an edge merge scheme.

According to still another aspect of the present invention, a signal transmission apparatus is provided. The signal transmission apparatus includes an encoder to generate a parent Low Density Parity Check (LDPC) codeword vector by encoding an information vector including A (A≧1) information bits using a parent parity check matrix supporting a first coding rate, a puncturer to generate a final codeword vector by puncturing at least D (D≧1) parity bits among B (B≧1)+C (C≧1) parity bits included in the parent LDPC codeword vector and a transmitter to transmit the final codeword vector, wherein a parent bipartite graph corresponding to the parent parity check matrix is generated such that a child bipartite graph corresponding to a child parity check matrix supporting a second coding rate corresponds to an edge split scheme.

According to still another aspect of the present invention, a signal reception apparatus is provided. The signal reception apparatus includes a receiver to receive a signal and a decoder to generate a child Low Density Parity Check (LDPC) codeword vector by decoding the received signal using a child parity check matrix supporting a first coding rate, wherein the child LDPC codeword vector includes an information vector including A (A≧1) information bits, and when the first coding rate is equal to a coding rate for a case where D (D≧1) parity bits are punctured among B (B≧1)+C (C≧1) parity bits included in a parent LDPC codeword vector generated by encoding the information vector using a parent parity check matrix supporting a second coding rate, a child bipartite graph corresponding to the child parity check matrix is generated such that a parent bipartite graph corresponding to the parent parity check matrix corresponds to an edge merge scheme.

According to still another aspect of the present invention, a signal reception apparatus is provided. The signal reception apparatus includes a receiver to receive a signal and a decoder to generate a parent Low Density Parity Check (LDPC) codeword vector by decoding the received signal using a parent parity check matrix supporting a first coding rate, wherein the parent LDPC codeword vector includes an information vector including A (A≧1) information bits, and a parent bipartite graph corresponding to the parent parity check matrix is generated such that a child bipartite graph corresponding to a child parity check matrix supporting a second coding rate corresponds to an edge split scheme.

BRIEF DESCRIPTION OF THE DRAWINGS

The above and other aspects, features and advantages of certain exemplary embodiments of the present invention will become more apparent from the following detailed description when taken in conjunction with the accompanying drawings in which:

FIG. 1 is a diagram illustrating a parity check matrix of an LDPC code according to an exemplary embodiment of the present invention;

FIG. 3 is a diagram illustrating a parity check matrix of an LDPC code supporting a coding rate of ⅔ according to an exemplary embodiment of the present invention;

FIG. 4 is a diagram illustrating a parity check matrix of an LDPC code supporting a coding rate of ½ according to an exemplary embodiment of the present invention;

Throughout the drawings, it should be noted that like reference numbers are used to depict the same or similar elements, features and structures.

DETAILED DESCRIPTION OF EXEMPLARY EMBODIMENTS

Figure 2:
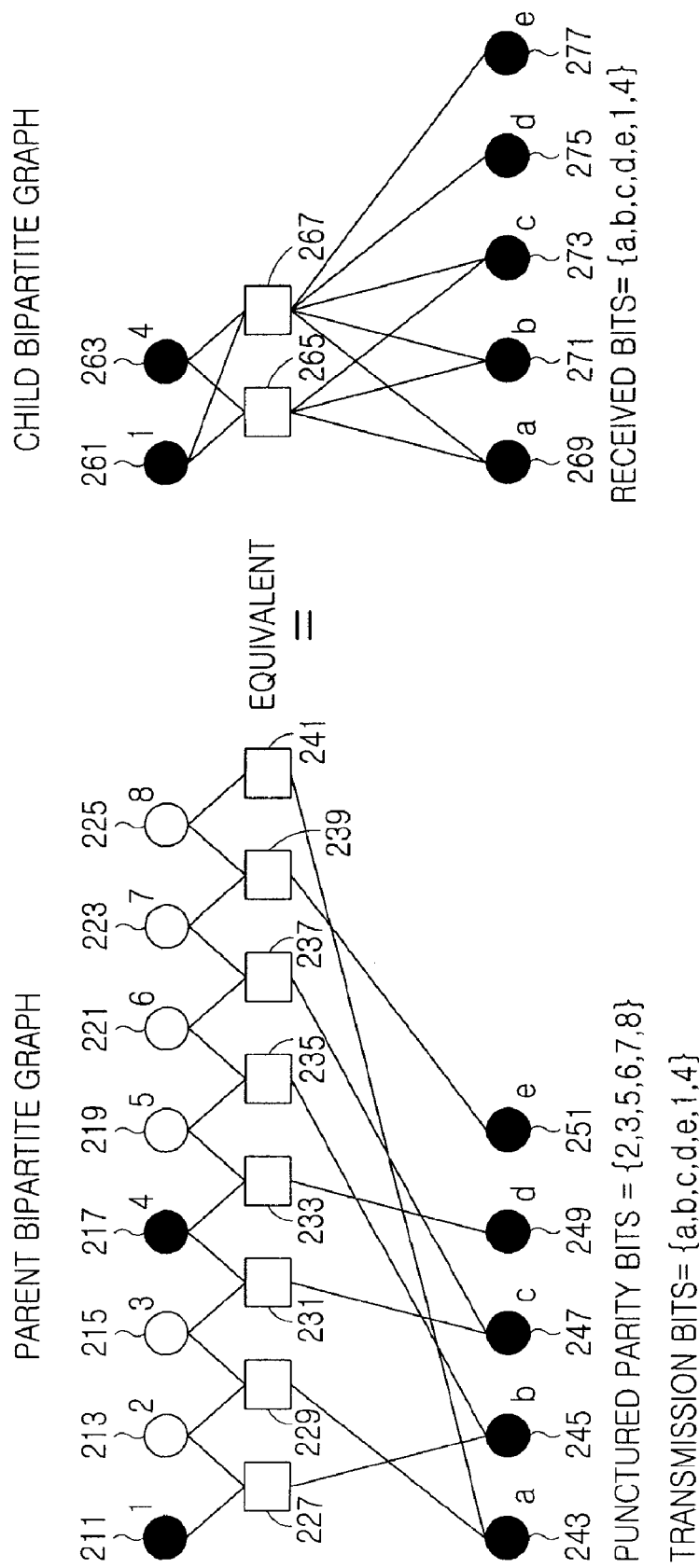
FIG. 2 is a diagram illustrating a parent bipartite graph and a child bipartite graph according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

In next generation communication systems, various transmission/reception schemes, such as Hybrid Automatic Repeat reQuest (HARQ) scheme and Adaptive Modulation and Coding (AMC) scheme, have been proposed to support high-speed, high-capacity data transmission/reception. To use HARQ and AMC schemes, the systems should support various coding rates. However, as described above, Low Density Parity Check (LDPC) codes, use of which is positively considered in the next generation communication systems, have limitations in terms of the coding rate due to their characteristics. Therefore, exemplary embodiments of the present invention provide a signal transmission/reception apparatus and method supporting various coding rates in a communication system using the LDPC codes.

FIG. 1 is a diagram illustrating a parity check matrix of an LDPC code according to an exemplary embodiment of the present invention.

Referring to FIG. 1, the parity check matrix should be designed to include a parent parity check matrix used for generating a parent codeword vector, i.e. a parent LDPC codeword vector, and a child parity check matrix used for generating a child codeword vector, i.e. a child LDPC codeword vector, having a coding rate different from the coding rate of the parent LDPC codeword vector. When an LDPC code is generated using the parity check matrix designed to include the parent parity check matrix and the child parity check matrix, the communication system can support various coding rates with only one codec. It should be noted in FIG. 1 that the parent parity check matrix and the child parity check matrix are not separately shown.

The parity check matrix includes an information part (s) 110, and parity parts, i.e. a first parity part ($p_1$) 120 and a second parity part ($p_2$) 130. When an information vector is generated as an LDPC codeword vector, the information part (s) 110 indicates a parity check matrix part mapped to the information vector, and the first parity part ($p_1$) 120 and the second parity part ($p_2$) 130 indicate parity check matrix parts mapped to parity vectors, i.e. a first parity vector and a second parity vector. The information vector includes A (A≧1) information bits, the first parity vector includes B (B≧1) parity bits, and the second parity vector includes C (C≧1) parity bits.

The parity check matrix of the LDPC code includes a plurality of blocks, to each of which a block matrix, for example, a permutation matrix or a zero matrix is mapped. The permutation matrix has a size of $N_s \times N_s$, and indicates a matrix in which each of $N_s$ rows has a weight of 1 and each of $N_s$ columns also has a weight of 1. As shown in FIG. 1, the parity check matrix of the LDPC code is divided into p×q blocks, and in FIG. 1, $P^{a_{pq}}$ indicates a block matrix located in the point where a $p^{th}$ Block Row (BR) and an $n^{th}$ Block Column (BC), among the blocks of the parity check matrix, cross each other.

With reference to FIG. 2, a description will now be made of a parent bipartite graph and a child bipartite graph according to an exemplary embodiment of the present invention.

FIG. 2 is a diagram illustrating a parent bipartite graph and a child bipartite graph according to an exemplary embodiment of the present invention.

Referring to FIG. 2, the parent bipartite graph indicates a bipartite graph corresponding to a parent parity check matrix, and the child bipartite graph indicates a bipartite graph corresponding to a child parity check matrix. The parent bipartite graph includes variable nodes 211, 213, 215, 217, 219, 221, 223 and 225 mapped to parity bits 1, 2, 3, 4, 5, 6, 7 and 8 included in a parent LDPC codeword vector, check nodes 227, 229, 231, 233, 235, 237, 239 and 241, and variable nodes 243, 245, 247, 249 and 251 mapped to information bits a, b, c, d and e included in the parent LDPC codeword vector. Of the parity bits, the parity bits 2, 3, 5, 6, 7 and 8 are assumed to be punctured. Therefore, in FIG. 2, the variable nodes corresponding to the parity bits to be punctured are variable nodes 213, 215, 219, 221, 223 and 225. In this case, the number D (D≧1) of check nodes is 8, and the number E (E≧1) of parity bits to be punctured is 6.

As for the parity check matrix, when an LDPC code having degree-2 variable nodes for a parity part, like an accumulator or dual-diagonal structure, is punctured, the parent bipartite graph can be simplified and expressed as a child bipartite graph according to a characteristic of check nodes. However, the structure having degree-2 variable nodes is not limited to the parity check matrix having the accumulator or dual-diagonal structure in the parity part. When codeword bits corresponding to the degree-2 variable nodes are punctured, the punctured variable nodes cannot receive information from the channel. When two edges connected to the variable nodes punctured during decoding are defined as x and y, information input to the edge x is intactly delivered to the edge y, and information input to the edge y is intactly delivered to the edge x. Therefore, check nodes connected to the two edges can be merged into one check node. A scheme of generating a child bipartite graph from a parent bipartite graph having parity bits to be punctured from an LDPC codeword vector, i.e. a scheme of merging check nodes connected to two edges into one check node, will herein be referred to as an 'edge merge scheme'. The child bipartite graph includes variable nodes 261 and 263 corresponding to parity bits 1 and 4 except for the punctured parity bits 2, 3, 5, 6, 7 and 8 among the parity bits 1, 2, 3, 4, 5, 6, 7 and 8 included in the parent LDPC codeword vector; check nodes 265 and 267; and variable nodes 269, 271, 273, 275 and 277 corresponding to information bits a, b, c, d and e included in the parent LDPC codeword vector.

Therefore, when a signal transmission apparatus generates a parent LDPC codeword vector using a parent parity check matrix, and transmits it after puncturing parity bits from the parent LDPC codeword vector, a signal reception apparatus may decode received signals using a child bipartite graph rather than a parent bipartite graph, thereby increasing a decoding convergence speed and reducing the number of decoding operations. This contributes to a reduction in the entire decoding complexity of the signal reception apparatus. That is, in FIG. 2, when the signal transmission apparatus transmits {a,b,c,d,e,1,4}, the signal reception apparatus decodes received signals {a,b,c,d,e,1,4} using the child bipartite graph.

A description has been made of the case where the signal transmission apparatus generates a parent LDPC codeword vector using a parent parity check matrix and transmits it after puncturing parity bits from the parent LDPC codeword vector. On the contrary, when the signal transmission apparatus has parity bits that it will puncture from the parent LDPC codeword vector, the signal transmission apparatus can directly generate a child bipartite graph from the parent bipartite graph using the edge merge scheme, and transmit signals according to the child bipartite graph, making it possible to support various coding rates.

Herein, the signal transmission apparatus can generate the child bipartite graph from the parent bipartite graph of the parent LDPC codeword vector having parity bits to be punctured, using the edge merge scheme. On the contrary, the signal transmission apparatus can also generate, from the child bipartite graph, the parent bipartite graph of the parent LDPC codeword vector having parity bits to be punctured. A scheme of generating from the child bipartite graph the parent bipartite graph having parity bits to be punctured will herein be referred to as an 'edge split scheme'. With reference to FIGS. 3 and 4, a description will now be made of the edge merge scheme and the edge split scheme.

FIG. 3 is a diagram illustrating a parity check matrix of an LDPC code supporting a coding rate of ⅔ according to an exemplary embodiment of the present invention.

Referring to FIG. 3, the parity check matrix includes 4 BRs of a BR1 311, a BR2 313, a BR3 315 and a BR4 317, and 12 BCs of a BC1 319, a BC2 321, a BC3 323, a BC4 325, a BC5 327, a BC6 329, a BC7 331, a BC8 333, a BC9 335, a BC10 337, a BC11 339 and a BC12 341. Therefore, the parity check matrix includes a total of 12×4 blocks, to each of which a block matrix $P^{a_{pq}}$ is mapped.

In FIG. 3, the numeral written in each block indicates an exponent $a_{pq}$ of a block matrix $P^{a_{pq}}$ mapped to each block. For $a_{pq}=-1$, it indicates that the corresponding block matrix $P^{a_{pq}}$ is a zero (0) matrix, and for $a_{pq}=1$, it indicates that the corresponding block matrix $P^{a_{pq}}$ is an identity matrix. It should be noted herein that an exponent of a block matrix mapped to each block is also expressed as an 'exponent of a block'. Because, for $a_{pq}=1$, it indicates that the corresponding block matrix $P^{a_{pq}}$ is an identity matrix, as the $a_{pq}$ value increases in this manner, the identity matrix is right-shifted in a permutation matrix.

Of the 12 BCs, the 8 left BCs of BC1 319 to BC8 333 correspond to an information part (s) 310. One BC succeeding the information part (s) 310, i.e. BC9 335, corresponds to a first parity part ($p_1$) 320, and the other 3 BCs, i.e. BC10 337 to BC12 341, correspond to a second parity part (p2) 330. It can be seen from FIG. 3 that the second parity part ($p_2$) 330 has a dual-diagonal structure.

When there is the parity check matrix shown in FIG. 3, it is possible to add variable nodes corresponding to new parity bits by splitting check nodes in a bipartite graph corresponding thereto, i.e. by using the edge split scheme. The bipartite graph corresponding to the parity check matrix of FIG. 3 will be assumed herein as a child bipartite graph, so the parent bipartite graph is a bipartite graph corresponding to a parity check matrix shown in FIG. 4. That is, the parity check matrix shown in FIG. 3 is a child parity check matrix, and the parity check matrix shown in FIG. 4 is a parent parity check matrix.

FIG. 4 is a diagram illustrating a parity check matrix of an LDPC code supporting a coding rate of ½ according to an exemplary embodiment of the present invention.

Referring to FIG. 4, the parity check matrix includes 8 BRs of BR1 411, BR2 413, BR3 415, BR4 417, BR5 419, BR6 421, BR7 423 and BR8 425, and 16 BCs of BC1 427, BC2 429, BC3 431, BC4 433, BC5 435, BC6 437, BC7 439, BC8 441, BC9 443, BC10 445, BC11 447, BC12 449, BC13 451, BC14 453, BC15 455, and BC16 457. Therefore, the parity check matrix includes a total of 16×8 blocks, to each of which a block matrix $P^{a_{pq}}$ is mapped. Similarly, the numeral written in each block indicates an exponent $a_{pq}$ of a block matrix $P^{a_{pq}}$ mapped to each block.

Of the 16 BCs, the 8 left BCs, i.e. BC1 427 to BC8 441, correspond to an information part (s) 410. One BC succeeding the information part (s) 410, i.e. BC9 443, corresponds to a first parity part ($p_1$) 420, and the other 7 BCs, i.e. BC10 445 to BC16 457, correspond to a second parity part ($p_2$) 430. It can be seen from FIG. 4 that the second parity part ($p_2$) 430 has a dual-diagonal structure.

A detailed description will now be made of a method for generating the rate-½ parent parity check matrix of FIG. 4 from the rate-⅔ child parity check matrix of FIG. 3 using the edge split scheme.

The edge split scheme proposed by the present invention complies with the following rules.

(1) First Rule (Rule for Splitting BRs in Information Part and First Parity Part)

When a BR of a child parity check matrix is split into a number of, for example, 2 BRs, exponent values of a block matrix in the BR are located in a BR having a position among the 2 split BRs, for example, located in one of the two BRs. However, a position of the BC where each exponent value is located is fixed, and an exponent value of the block matrix is set to '−1' so that a 0 matrix is mapped to the blocks except for the block where each exponent value is located in an information part and a first parity part of a parent parity check matrix.

For example, when a BR1 311 of the child parity check matrix shown in FIG. 3 is split, an exponent value of a block matrix corresponding to a BC1 319 in the BR1 311 is 5, and an exponent value of a block matrix corresponding to a BC2 321 is 8. The BR1 311 is further split into a BR1 411 and a BR2 413 of the parent parity check matrix shown in FIG. 4. In this case, an exponent value 5 of the block corresponding to the BC1 319 is located in the BR1 411 of the information part (s) 410, and an exponent value 8 of the block mapped to the BC2 321 is located in the BR2 413. In the process of generating the parent parity check matrix shown in FIG. 4 from the child parity check matrix shown in FIG. 3, each BR of the child parity check matrix shown in FIG. 3 is split into two blocks. In this case, the system determines in which BR it will locate the corresponding exponent value, using a cycle removing algorithm which is used for selecting block exponent values of an LDPC code. Therefore, not only the child parity check matrix shown in FIG. 3 but also the parent parity check matrix shown in FIG. 4 may have a high-performance cycle structure, making it possible to generate high-performance LDPC codes not only at a high coding rate but also at a low coding rate.

(2) Second Rule (Rule for Splitting BRs in Second Parity Part)

When a BR of a child parity check matrix is split into a number of, for example, 2 BRs, BCs are added such that a second parity part of a parent parity check matrix has a dual-diagonal structure, and an exponent value of the block matrix is set to '−1' such that a 0 matrix is mapped to the blocks except for the blocks constituting a dual-diagonal structure in a second parity part of the parent parity check matrix.

For example, when the BR1 311 of the child parity check matrix shown in FIG. 3 is split, a BC10 445 indicating an identity matrix is added to the second parity part ($p_2$) 430 of the parent parity check matrix shown in FIG. 4 such that a weight of the BC is 2 and its exponent value can indicate a dual-diagonal structure of the second parity part ($p_2$) 430. Because the BR1 311 is further split into the BR1 411 and the BR2 413 of the parent parity check matrix shown in FIG. 4, identity matrixes are located only in the block matrix mapped to the BR1 411 in the BC10 445 and block matrix mapped to the BR2 413. Similarly, because a BR2 313 of the child parity check matrix shown in FIG. 3 is split into BR3 415 and a BR4 417 of the parent parity check matrix shown in FIG. 4, a BC12 449 indicating an identity matrix is added such that it indicates a dual-diagonal structure of the second parity part ($p_2$) 430. In addition, because the BR2 313 is split into the BR3 415 and the BR4 417, identity matrixes are located only in the block matrix mapped to the BR3 415 in the BC12 449 and the block matrix mapped to the BR4 417. In this manner, BCs indicating identity matrixes are added such that they indicate a dual-diagonal structure of the second parity part ($p_2$) 430.

A detailed description will now be made of a method for generating the rate-⅔ child parity check matrix of FIG. 3 from the rate-½ parent parity check matrix of FIG. 4, using the edge merge scheme.

The edge merge scheme proposed by the present invention complies with the following rules.

(1) First Rule (Rule for Merging BRs in Information Part and First Parity Part)

When a number of, for example, 2 BRs of a parent parity check matrix are merged into one BR of a child parity check matrix, only the non-'−1' exponent value among the exponent values of block matrixes in the 2 BRs of the parent parity check matrix is set as an exponent value of the block matrix mapped to an arbitrary BC in the BR of the child parity check matrix on the basis of the arbitrary BC. However, a position of the BC in the BR where each non-'−1' exponent value is located is fixed. For the parent parity check matrix, because the child parity check matrix can be split using the edge split scheme, a non-'−1' exponent value exists only in any one of 2 BRs merged on the basis of an arbitrary BC, and an exponent value of '−1' exists in the other BR.

For example, when the BR1 411 and the BR2 413 of the parent parity check matrix shown in FIG. 4 are merged, an exponent value of the block matrix mapped to the BC1 427 in the BR1 411 is 5, and an exponent value of the block matrix mapped to the BC1 427 in the BR2 413 is −1. When the BR1 411 and the BR2 413 are merged into the BR1 311 of the parent parity check matrix shown in FIG. 3, because a non-'−1' exponent value among its block exponent values is 5, an exponent value of the block matrix mapped to the BR1 311 in the BC1 427 is 5.

(2) Second Rule (Rule for Merging BRs in Second Parity Part)

When a number of, for example, 2 BRs of a parent parity check matrix are merged into one BR, BCs are merged such that a second parity part of a child parity check matrix has a dual-diagonal structure. For the parent parity check matrix, because the child parity check matrix can be split using the edge split scheme, BCs are merged such that a second parity part of the child parity check matrix has a dual-diagonal structure in the manner of removing BCs mapped to parity bits punctured from the codeword vector generated using the parent parity check matrix, and connecting the remaining non-removed BCs.

For example, when the BR1 411 and the BR2 413 of the parent parity check matrix shown in FIG. 4 are merged, BC10 445, BC12 449, BC14 453 and BC16 457 mapped to the punctured parity bits are removed, and the remaining non-removed BCs, i.e. BC11 447, BC13 451 and BC15 453, are connected. In this manner, BCs are merged such that a second parity part of the child parity check matrix has a dual-diagonal structure.

Although a description of the edge split scheme proposed by an exemplary embodiment the present invention has been made for the case where each of all BRs of the child parity check matrix is split into a number of, for example, 2 BRs, the edge split scheme can also split each of not all BRs but some BRs into 2 BRs. There are several possible methods of selecting some BRs. For example, it is possible to split the BRs such that a degree distribution after splitting can guarantee high performance. In addition, it is possible to select BRs that will be split at regular intervals. If the number of BRs is 10 and the number of BRs to be split is 2, it is possible to select a first BR and a fifth BR. Therefore, it is possible to provide an LDPC code that supports various coding rates.

When various coding rates are supported according to the edge merge scheme and edge split scheme proposed by an exemplary embodiment of the present invention, because LDPC codeword vectors having various coding rates are all child LDPC codeword vectors punctured from the same parent LDPC codeword vector, they form the same LDPC codeword vector set. The 'same LDPC codeword vector set' refers to a set of the same LDPC codeword vectors generated for the same information vectors. Because it is possible to generate the same LDPC codeword vector set in this way, it is easy to apply HARQ Incremental Redundancy (IR) scheme. That is, when various coding rates are supported according to the edge merge scheme and edge split scheme proposed by an exemplary embodiment of the present invention, it is possible to generate the same LDPC codeword vector set even though the coding rates are different.

Figure 5:
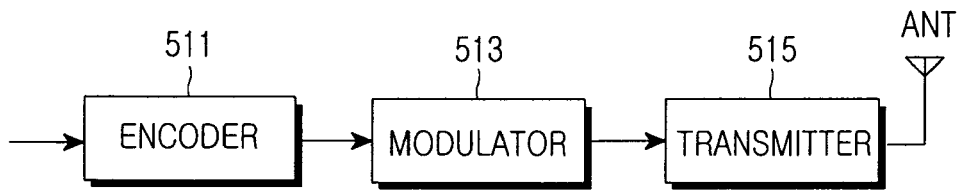
FIG. 5 is a schematic diagram illustrating a structure of a signal transmission apparatus supporting various coding rates in a communication system using an LDPC code according to an exemplary embodiment of the present invention.

With reference to FIG. 5, a description will now be made of a structure of a signal transmission apparatus supporting various coding rates in a communication system using an LDPC code according to an exemplary embodiment of the present invention.

FIG. 5 is a schematic diagram illustrating a structure of a signal transmission apparatus supporting various coding rates in a communication system using an LDPC code according to an exemplary embodiment of the present invention.

Referring to FIG. 5, the signal transmission apparatus includes an encoder 511, a modulator 513 and a transmitter 515.

If an information vector that the signal transmission apparatus desires to transmit is generated, the information vector is delivered to the encoder 511. The encoder 511 encodes the information vector using a coding scheme to generate the final LDPC codeword vector, and outputs the LDPC codeword vector to the modulator 513. The coding scheme used herein is an LDPC coding scheme supporting various coding rates, described above. That is, the encoder 511 generates a parent parity check matrix or a child parity check matrix using the edge split scheme and edge merge scheme described above, thereby supporting various coding rates. The encoder 511 can generate, when needed, the parent parity check matrix or the child parity check matrix according to a used cording rate using the edge split scheme and edge merge scheme. Alternatively, the encoder 511 can previously generate and store the parent parity check matrix or child parity check matrix using the edge split scheme and edge merge scheme, for future use.

The modulator 513 modulates the LDPC codeword vector using a modulation scheme to generate a modulation vector, and outputs the modulation vector to the transmitter 515. The transmitter 515 performs transmission processing on the modulation vector output from the modulator 513, and transmits the processed modulation vector to a signal reception apparatus via an antenna.

Figure 6:
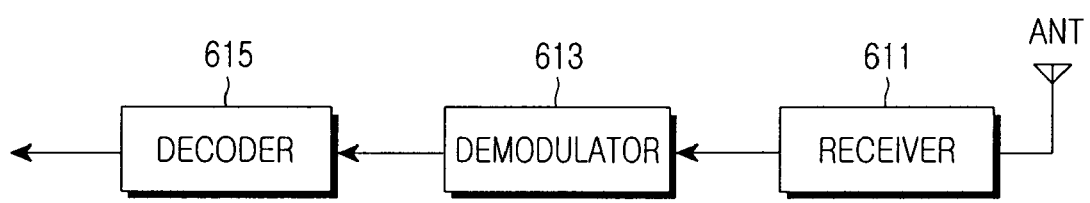
FIG. 6 is a schematic diagram illustrating a structure of a signal reception apparatus supporting various coding rates in a communication system using an LDPC code according to an exemplary embodiment of the present invention.

With reference to FIG. 6, a description will now be made of a structure of a signal reception apparatus supporting various coding rates in a communication system using an LDPC code according to an exemplary embodiment of the present invention.

FIG. 6 is a schematic diagram illustrating a structure of a signal reception apparatus supporting various coding rates in a communication system using an LDPC code according to an exemplary embodiment of the present invention.

Referring to FIG. 6, the signal reception apparatus includes a receiver 611, a demodulator 613, and a decoder 615. A signal transmitted by a signal transmission apparatus is received at the signal reception apparatus via an antenna, and the received signal is delivered to the receiver 611. The receiver 611 performs reception processing on the signal received via the antenna, and outputs the processed signal to the demodulator 613. The demodulator 613 demodulates the signal output from the receiver 611 using a demodulation scheme corresponding to the modulation scheme used in the modulator 513 of the signal transmission apparatus, and outputs the demodulated signal to the decoder 615. The decoder 615 decodes the signal output from the demodulator 613 using a decoding scheme corresponding to the coding scheme used in the encoder 511 of the signal transmission apparatus, and outputs the decoded signal as a finally restored information vector. The decoding scheme used herein is an LDPC decoding scheme corresponding to the LDPC coding scheme.

That is, the decoder 615 can generate the parent parity check matrix or child parity check matrix using the edge split scheme and edge merge scheme described above, thereby supporting various coding rates. The decoder 615 can generate, when needed, the parent parity check matrix or the child parity check matrix according to a used cording rate using the edge split scheme and edge merge scheme. Alternatively, the decoder 615 can previously generate and store the parent parity check matrix or child parity check matrix using the edge split scheme and edge merge scheme, for future use.

In FIG. 5, when the encoder 511 of the signal transmission apparatus needs to support a coding rate exceeding the coding rate supported by the parent parity check matrix, it generates a child parity check matrix using the edge merge scheme, and then generates an LDPC codeword vector using the child parity check matrix. However, the encoder 511 can generate the LDPC codeword vector depending only on the parent parity check matrix. Even though the signal transmission apparatus has transmitted parity bits after puncturing them using a separate puncturer (not shown), the decoder 615 of the signal reception apparatus, as it recognizes the puncturing of the parity bits, can decode the received signal using the child parity check matrix using the edge merge scheme.

As is apparent from the foregoing description, exemplary embodiments of the present invention enable the communication system using an LDPC code to transmit/receive signals at various supportable coding rates. In addition, exemplary embodiments of the present invention allow the communication system using LDPC code to support various coding rates only with one codec, thereby contributing to minimization of the hardware complexity.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method to transmit a signal in a signal transmission apparatus, the method comprising:
    generating a final codeword vector by encoding an information vector including A (A≧1) information bits using one of a child parity check matrix and a parent parity check matrix; and
    transmitting the final codeword vector,
    wherein, if a child Low Density Parity Check (LDPC) codeword vector as the final codeword vector is generated by encoding the information vector using the child parity check matrix supporting a first coding rate, a child bipartite graph corresponding to the child parity check matrix is generated by using a parent bipartite graph corresponding to the parent parity check matrix supporting a second coding rate according to an edge merge scheme, and
    if a parent LDPC codeword vector is generated by encoding the information vector using the parent parity check matrix and the final codeword vector is generated by using the parent LDPC codeword vector, the parent bipartite graph is generated by using the child bipartite graph according to an edge split scheme.

2. The method of claim 1, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1,
    wherein the parent parity check matrix comprises a first information part mapped to the information vector, a first parity part mapped to B parity bits, and a second parity part mapped to C parity bits, and
    wherein the child LDPC codeword vector is generated, when the first coding rate is equal to a coding rate for a case where D (D≧1) parity bits are punctured among B (B≧1)+C (C≧1) parity bits included in a parent LDPC codeword vector.

3. The method of claim 2, wherein the child parity check matrix comprises a second information part mapped to the information vector, a third parity part mapped to the B parity bits, and a fourth parity part mapped to C−D parity bits,
    wherein the edge merge scheme is one of a first scheme and a second scheme, the first scheme comprises:
    when merging block rows included in the first information part and the first parity part, merging a first number of block rows among the block rows included in the first information part and the first parity part into one block row included in the second information part and a third information part, such that for an arbitrary block column, only a non-'−1' exponent value $a_{pq}$ among the exponent values $a_{pq}$ of block matrixes included in the first number of the block rows is set as an exponent value $a_{pq}$ of a block matrix $P^{a_{pq}}$ corresponding to the arbitrary block column among the block matrixes included in the first number of the block rows, wherein a position of a block column in a block row where each non-'−1' exponent value $a_{pq}$ is located is fixed; and
    when merging block rows included in the second parity part, merging block columns such that the fourth parity part has a dual-diagonal structure, thereby generating the child parity check matrix, and
    wherein the second scheme comprises a scheme for merging variable nodes except for variable nodes corresponding to the D parity bits to be punctured among B+C variable nodes corresponding to the B+C parity bits included in the parent bipartite graph, thereby generating the child bipartite graph.

4. The method of claim 1, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1,
    wherein the parent parity check matrix comprises a first information part mapped to the information vector, a first parity part mapped to B parity bits, and a second parity part mapped to C parity bits, and
    wherein the final codeword vector is generated by puncturing at least D (D≧1) parity bits among B (B≧1)+C (C≧1) parity bits included in the parent LDPC codeword vector, if the parent LDPC codeword vector is generated by encoding the information vector using the parent parity check matrix.

5. The method of claim 4, wherein the child parity check matrix comprises a second information part mapped to the information vector, a third parity part mapped to the B parity bits, and a fourth parity part mapped to C−D parity bits,
    wherein the edge split scheme is one of a first scheme and a second scheme, the first scheme comprises:
    in a process of splitting a block row included in the second information part and the third parity part, when the block row included in the second information part and the third parity part is split into a first number of block rows included in the first information part and the second parity part, locating exponent values $a_{pq}$ of block matrixes included in the block row included in the second information part and the third parity part, in a block row having a position among the first number of the block rows, wherein a position of a block column where each exponent value $a_{pq}$ is located is fixed, and setting, as −1, exponent values $a_{pq}$ of block matrixes corresponding to blocks except for blocks where the exponent values $a_{pq}$ are located, among blocks of the block matrixes included in the block row included in the second information part and the third parity part; and
    in a process of splitting a block row included in the fourth parity part, when the block row included in the fourth parity part is split into the first number of the block rows included in the second parity part, adding block columns such that the second parity part has a dual-diagonal structure,
    wherein the second scheme comprises a scheme for splitting E (E≧1) check nodes connected to variable nodes corresponding to B+C−D parity bits included in the child bipartite graph, thereby generating the parent bipartite graph such that it includes variable nodes corresponding to the B+C parity bits.

6. A signal transmission apparatus, the apparatus comprising:
an encoding block to generate a final codeword vector by encoding an information vector including A (A≧1) information bits using one of a child parity check matrix and a parent parity check matrix; and
a transmitter to transmit the final codeword vector,
wherein, if a child Low Density Parity Check (LDPC) codeword vector as the final codeword vector is generated by encoding the information vector using the child parity check matrix supporting a first coding rate, a child bipartite graph corresponding to the child parity check matrix is generated by using a parent bipartite graph corresponding to the parent parity check matrix supporting a second coding rate according to an edge merge scheme, and
if a parent LDPC codeword vector is generated by encoding the information vector using the parent parity check matrix and the final codeword vector is generated by using the parent LDPC codeword vector, the parent bipartite graph is generated by using the child bipartite graph according to an edge split scheme.

7. The signal transmission apparatus of claim 6, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1 and the block matrix $P^{a_{pq}}$ including an identity matrix when the exponent value $a_{pq}$ of the block matrix $P^{a_{pq}}$ is 1,
wherein the parent parity check matrix comprises a first information part mapped to the information vector, a first parity part mapped to B parity bits, and a second parity part mapped to C parity bits, and
wherein the child LDPC codeword vector is generated, when the first coding rate is equal to a coding rate for a case where D (D≧1) parity bits are punctured among B (B≧1)+C (C≧1) parity bits included in a parent LDPC codeword vector generated by encoding the information vector using the parent parity check matrix.

8. The signal transmission apparatus of claim 7, wherein the child parity check matrix comprises a second information part mapped to the information vector, a third parity part mapped to the B parity bits, and a fourth parity part mapped to C−D parity bits,
wherein the edge merge scheme is one of a first scheme and a second scheme, the first scheme comprises:
when merging block rows included in the first information part and the first parity part, merging a first number of block rows among the block rows included in the first information part and the first parity part into one block row included in the second information part and a third information part, such that for an arbitrary block column, only a non-'−1' exponent value $a_{pq}$ among the exponent values $a_{pq}$ of block matrixes included in the first number of the block rows is set as an exponent value $a_{pq}$ of a block matrix $P^{a_{pq}}$ corresponding to the arbitrary block column among the block matrixes included in the first number of the block rows, wherein a position of a block column in a block row where each non-'−1' exponent value $a_{pq}$ is located is fixed; and
when merging block rows included in the second parity part, merging block columns such that the fourth parity part has a dual-diagonal structure, thereby generating the child parity check matrix, and
wherein the second scheme comprises a scheme for merging variable nodes except for variable nodes corresponding to the D parity bits to be punctured among B+C variable nodes corresponding to the B+C parity bits included in the parent bipartite graph, thereby generating the child bipartite graph.

9. The signal transmission apparatus of claim 6, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1,
wherein the parent parity check matrix comprises a first information part mapped to the information vector, a first parity part mapped to B parity bits, and a second parity part mapped to C parity bits, and
wherein the final codeword vector is generated by puncturing at least D (D≧1) parity bits among B (B≧1)+C (C≧1) parity bits included in the parent LDPC codeword vector, if the parent LDPC codeword vector is generated by encoding the information vector using the parent parity check matrix.

10. The signal transmission apparatus of claim 9, wherein the child parity check matrix comprises a second information part mapped to the information vector, a third parity part mapped to the B parity bits, and a fourth parity part mapped to C−D parity bits,
wherein the edge split scheme is one of a first scheme and a second scheme, the first scheme comprises:
in a process of splitting a block row included in the second information part and the third parity part, when the block row included in the second information part and the third parity part is split into a first number of block rows included in the first information part and the second parity part, locating exponent values $a_{pq}$ of block matrixes included in the block row included in the second information part and the third parity part, in a block row having a position among the first number of the block rows, wherein a position of a block column where each exponent value $a_{pq}$ is located is fixed, and setting, as −1, exponent values $a_{pq}$ of block matrixes corresponding to blocks except for blocks where the exponent values $a_{pq}$ are located, among blocks of the block matrixes included in the block row included in the second information part and the third parity part; and
in a process of splitting a block row included in the fourth parity part, when the block row included in the fourth parity part is split into the first number of the block rows included in the second parity part, adding block columns such that the second parity part has a dual-diagonal structure, and
wherein the first scheme comprises a scheme for splitting E (E≧1) check nodes connected to variable nodes corresponding to B+C−D parity bits included in the child bipartite graph, thereby generating the parent bipartite graph such that it includes variable nodes corresponding to the B+C parity bits.

11. A method to receive a signal in a signal reception apparatus, the method comprising:
receiving a signal; and
generating a codeword vector by decoding the received signal using one of a child parity check matrix and a parent parity check matrix, wherein, if a child Low Density Parity Check (LDPC) codeword vector as the final codeword vector is generated by encoding the information vector using the child parity check matrix supporting a first coding rate, a child bipartite graph corresponding to the child parity check matrix is generated by using a parent bipartite graph corresponding to the parent parity check matrix supporting a second coding rate according to an edge merge scheme, and if a parent LDPC codeword vector is generated by encoding the information vector using the parent parity check matrix and the final codeword vector is generated by using the parent LDPC codeword vector, the parent bipartite graph is generated by using the child bipartite graph according to an edge split scheme.

12. The method of claim 11, wherein the parent parity check matrix and the child parity check matrix each include a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1, wherein the parent parity check matrix comprises a first information part mapped to the information vector, a first parity part mapped to B parity bits, and a second parity part mapped to C parity bits, and wherein the child LDPC codeword vector includes an information vector including A (A≧1) information bits, and the child LDPC codeword vector is generated when the first coding rate is equal to a coding rate for a case where D (D≧1) parity bits are punctured among B (B≧1)+C (C≧1) parity bits included in the parent LDPC codeword vector.

13. The method of claim 12, wherein the child parity check matrix comprises a second information part mapped to the information vector, a third parity part mapped to the B parity bits, and a fourth parity part mapped to C−D parity bits, wherein the edge merge scheme is one of a first scheme and a second scheme, the first scheme comprises:

when merging block rows included in the first information part and the first parity part, merging a first number of block rows among the block rows included in the first information part and the first parity part into one block row included in the second information part and a third information part, such that for an arbitrary block column, only a non-'−1' exponent value $a_{pq}$ among the exponent values $a_{pq}$ of block matrixes included in the first number of the block rows is set as an exponent value $a_{pq}$ of a block matrix $P^{a_{pq}}$ corresponding to the arbitrary block column among the block matrixes included in the first number of the block rows, wherein a position of a block column in a block row where each non-'−1' exponent value $a_{pq}$ is located is fixed; and when merging block rows included in the second parity part, merging block columns such that the fourth parity part has a dual-diagonal structure, thereby generating the child parity check matrix, and wherein the second scheme comprises a scheme for merging variable nodes except for variable nodes corresponding to the D parity bits to be punctured among B+C variable nodes corresponding to the B+C parity bits included in the parent bipartite graph, thereby generating the child bipartite graph.

14. The method of claim 11, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1, wherein the parent parity check matrix comprises a first information part mapped to the information vector, a first parity part mapped to B parity bits, and a second parity part mapped to C parity bits, and wherein the parent LDPC codeword vector includes an information vector including A (A≧1) information bits.

15. The method of claim 14, wherein the child parity check matrix comprises a second information part mapped to the information vector, a third parity part mapped to the B parity bits, and a fourth parity part mapped to C−D parity bits, where D (D≧1) denotes a number of punctured parity bits among B+C parity bits, wherein the edge split scheme is one of a first scheme and a second scheme, the first scheme comprises:

in a process of splitting a block row included in the second information part and the third parity part, when the block row included in the second information part and the third parity part is split into a first number of block rows included in the first information part and the second parity part, locating exponent values $a_{pq}$ of block matrixes included in the block row included in the second information part and the third parity part, in a block row having a position among the first number of the block rows, wherein a position of a block column where each exponent value $a_{pq}$ is located is fixed, and setting, as −1, exponent values $a_{pq}$ of block matrixes corresponding to the blocks except for the blocks where the exponent values $a_{pq}$ are located, among blocks of the block matrixes included in the block row included in the second information part and the third parity part; and in a process of splitting a block row included in the fourth parity part, when the block row included in the fourth parity part is split into the first number of the block rows included in the second parity part, adding block columns such that the second parity part has a dual-diagonal structure, and wherein the second scheme comprises a scheme for splitting E (E≧1) check nodes connected to variable nodes corresponding to B+C−D parity bits included in the child bipartite graph, thereby generating the parent bipartite graph such that it includes variable nodes corresponding to the B+C parity bits.

16. A signal reception apparatus, the apparatus comprising:
a receiver to receive a signal; and
a decoder to generate a codeword vector by decoding the received signal using one of a child parity check matrix and a parent parity check matrix, wherein if a child Low Density Parity Check (LDPC) codeword vector as the final codeword vector is generated by encoding the information vector using the child parity check matrix supporting a first coding rate, a child bipartite graph corresponding to the child parity check matrix is generated by using a parent bipartite graph corresponding to the parent parity check matrix supporting a second coding rate according to an edge merge scheme, and if a parent LDPC codeword vector is generated by encoding the information vector using the parent parity check matrix and the final codeword vector is generated by using the parent LDPC codeword vector, the parent bipartite graph is generated by using the child bipartite graph according to an edge split scheme.

17. The signal reception apparatus of claim 16, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1, wherein the parent parity check matrix comprises a first information part mapped to the information vector, a first parity part mapped to B parity bits, and a second parity part mapped to C parity bits, wherein the child LDPC codeword vector includes an information vector including A (A≧1) information bits, and the child LDPC codeword vector is generated, when the first coding rate is equal to a coding rate for a case where D (D≧1) parity bits are punctured among B (B≧1)+C (C≧1) parity bits included in the parent LDPC codeword vector.

18. The signal reception apparatus of claim 17, wherein the child parity check matrix comprises a second information part mapped to the information vector, a third parity part mapped to the B parity bits, and a fourth parity part mapped to C−D parity bits, wherein the edge merge scheme is one of a first scheme and a second scheme, the first scheme comprises:

when merging block rows included in the first information part and the first parity part, merging a first number of block rows among the block rows included in the first information part and the first parity part into one block row included in the second information part and a third information part, such that for an arbitrary block column, only a non-'−1' exponent value $a_{pq}$ among the exponent values $a_{pq}$ of block matrixes included in the first number of the block rows is set as an exponent value $a_{pq}$ of a block matrix $P^{a_{pq}}$ corresponding to the arbitrary block column among the block matrixes included in the first number of the block rows, wherein a position of a block column in a block row where each non-'−1' exponent value $a_{pq}$ is located is fixed; and when merging block rows included in the second parity part, merging block columns such that the fourth parity part has a dual-diagonal structure, thereby generating the child parity check matrix, and wherein the second scheme comprises a scheme for merging variable nodes except for variable nodes corresponding to the D parity bits to be punctured among B+C variable nodes corresponding to the B+C parity bits included in the parent bipartite graph, thereby generating the child bipartite graph.

19. The signal reception apparatus of claim 16, wherein the parent parity check matrix and the child parity check matrix each comprise a plurality of blocks, a block matrix $P^{a_{pq}}$ is mapped to each of the plurality of blocks, the block matrix $P^{a_{pq}}$ including a zero (0) matrix when an exponent value $a_{pq}$ of the block matrix $P^{a_{pq}}$ is −1, and the block matrix $P^{a_{pq}}$ including an identity matrix when the exponent value $a_{pq}$ of the block matrix $P^{a_{pq}}$ is 1, wherein the parent parity check matrix comprises a first information part mapped to the information vector, a first parity part mapped to B parity bits, and a second parity part mapped to C parity bits, and wherein the parent LDPC codeword vector includes an information vector including A (A≧1) information bits.

20. The signal reception apparatus of claim 19, wherein the child parity check matrix comprises a second information part mapped to the information vector, a third parity part mapped to the B parity bits, and a fourth parity part mapped to C−D parity bits, where D (D≧1) denotes a number of punctured parity bits among B+C parity bits, wherein the edge split scheme is one of a first scheme and a second scheme, the first scheme comprises:

in a process of splitting a block row included in the second information part and the third parity part, when the block row included in the second information part and the third parity part is split into a first number of block rows included in the first information part and the second parity part, locating exponent values $a_{pq}$ of block matrixes included in the block row included in the second information part and the third parity part, in a block row having a position among the first number of the block rows, wherein a position of a block column where each exponent value $a_{pq}$ is located is fixed, and setting, as −1, exponent values $a_{pq}$ of block matrixes corresponding to blocks except for blocks where the exponent values $a_{pq}$ are located, among blocks of the block matrixes included in the block row included in the second information part and the third parity part; and in a process of splitting a block row included in the fourth parity part, when the block row included in the fourth parity part is split into the first number of the block rows included in the second parity part, adding block columns such that the second parity part has a dual-diagonal structure, and wherein the second scheme comprises a scheme for splitting E (E≧1) check nodes connected to variable nodes corresponding to B+C−D parity bits included in the child bipartite graph, thereby generating the parent bipartite graph such that it includes variable nodes corresponding to the B+C parity bits.

\* \* \* \* \*